United States Patent
Lim et al.

(10) Patent No.: US 8,015,459 B2
(45) Date of Patent: Sep. 6, 2011

(54) SEMICONDUCTOR MEMORY DEVICE AND METHOD OF PERFORMING A MEMORY OPERATION

(75) Inventors: Jong-Hyoung Lim, Hwaseong-si (KR); Sang-Seok Kang, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/654,644

(22) Filed: Dec. 28, 2009

(65) Prior Publication Data

US 2010/0106900 A1    Apr. 29, 2010

Related U.S. Application Data

(63) Continuation of application No. 11/730,273, filed on Mar. 30, 2007, now Pat. No. 7,657,800.

(30) Foreign Application Priority Data

Aug. 17, 2006    (KR) .................. 10-2006-0077400

(51) Int. Cl.
*G11C 29/00*    (2006.01)
(52) U.S. Cl. ..................................... 714/718
(58) Field of Classification Search ............ 714/718
See application file for complete search history.

(56) References Cited

U.S. PATENT DOCUMENTS

| | | | |
|---|---|---|---|
| 6,188,639 B1 | 2/2001 | Sakakibara | |
| 6,192,429 B1 | 2/2001 | Jeong et al. | |
| 6,252,804 B1 | 6/2001 | Tomita | 365/189.05 |
| 6,411,564 B2 | 6/2002 | Ikeda | 365/189.16 |
| 6,418,068 B1 * | 7/2002 | Raynham | 365/200 |
| 7,480,774 B2 * | 1/2009 | Ellis et al. | 711/154 |
| 2007/0061669 A1 * | 3/2007 | Major et al. | 714/758 |

* cited by examiner

*Primary Examiner* — James C Kerveros
(74) *Attorney, Agent, or Firm* — Muir Patent Consulting, PLLC (57) ABSTRACT

A semiconductor memory device and method directed to performing a memory operation in a semiconductor memory device are provided. The method includes receiving a write command signal from a memory controller; receiving data from the memory controller, the data including n pieces of data, wherein the k-th piece of data comprises masking data to be masked; and receiving a data masking signal from the memory controller, the data masking signal including enable information that enables data masking, and non-enable information for not enabling data masking, wherein the enable information is used to mask the k-th piece of data. A latency between receiving the write command signal and receiving the enable information is less than a latency between receiving the write command and receiving the k-th piece of data.

16 Claims, 6 Drawing Sheets

SEMICONDUCTOR MEMORY DEVICE AND METHOD OF PERFORMING A MEMORY OPERATION

PRIORITY STATEMENT

This application is a continuation of U.S. application Ser. No. 11/730,273 filed Mar. 30, 2007, now U.S. Pat. No. 7,657,800, which claims priority under 35 U.S.C. 119 of Korean Patent Application 10-2006-0077400 filed on Aug. 17, 2006, the entire contents of each of which is hereby incorporated by reference.

BACKGROUND OF THE INVENTION

1. Field of the Invention

Example embodiments of the present invention relate generally to a semiconductor memory device and method thereof, and more particularly to a semiconductor memory device and method of performing a memory operation.

2. Description of the Related Art

A conventional semiconductor memory device may include memory cell arrays having a row and column array structure. Data may be read from or written to a given memory cell among the memory cell array in response to a read or write command if a row address and a column address designating the given memory cell are received.

Dynamic random access memory (DRAM) devices may be semiconductor memory devices which operate at higher operating speeds. Examples of DRAM devices may include synchronous DRAM (SDRAM), double data rate (DDR) SDRAM, fast cycle RAM (FCRAM), etc.

In the SDRAM, an input/output of data may be valid only at a rising edge or falling edge of clock. Meanwhile, in the DDR SDRAM the input/output of date may be valid both at a rising edge and a falling edge of clock, thus the DDR SDRAM may have faster data transmission speeds as compared with SDRAM.

DDR DRAM may employ a DQ mask function, wherein DQ may indicate an input/output channel of data, and mask herein may mean to "cover" or protect data. A data masking signal DQM or DM signal may protect a given data portion such that the protected data portion may not be over-written during a write operation. In other words, an input/output for a portion of data may be disabled if the data masking signal corresponding to that data portion is activated.

In a conventional semiconductor memory device, an input/output of data may generally be controlled at a chipset level. During a data read command, data may be transferred from a memory cell to a central processing unit (CPU), and masking may be performed at the chipset itself such that data need not be actively masked. During a data write command, however, data may be transferred from a CPU to a memory cell, and the data portion to be protected may be masked so as not to be overwritten. Thus, data masking may typically be used only for write commands, and not read commands.

In conventional data masking processes masking data, an input/output driver may be controlled so as to load data on an input/output line, and a column selection line CSL may be controlled based on masking information, as will now be described in greater detail.

First, in the process of controlling an input/output driver, masking may be performed by turning off the input/output driver during a "normal" write operation which selects only one column selection line. Likewise, during a read operation, the input/output driver may be maintained in an off state such that the input/output line may be used for a read operation. However, the input/output driver may also be turned off when performing masking in a write operation by a unit of blocks to select a plurality of column selection lines, and the plurality of column selection lines may thereby be selected. Thus, cell data for the selected column selection lines may not be consistent, such that a memory failure may occur. Subsequently, in the process of controlling the column selection line CSL, if a data masking signal is input, a corresponding column selection line may be disabled, thus preventing data from being written to a particular memory cell.

Figure 1:
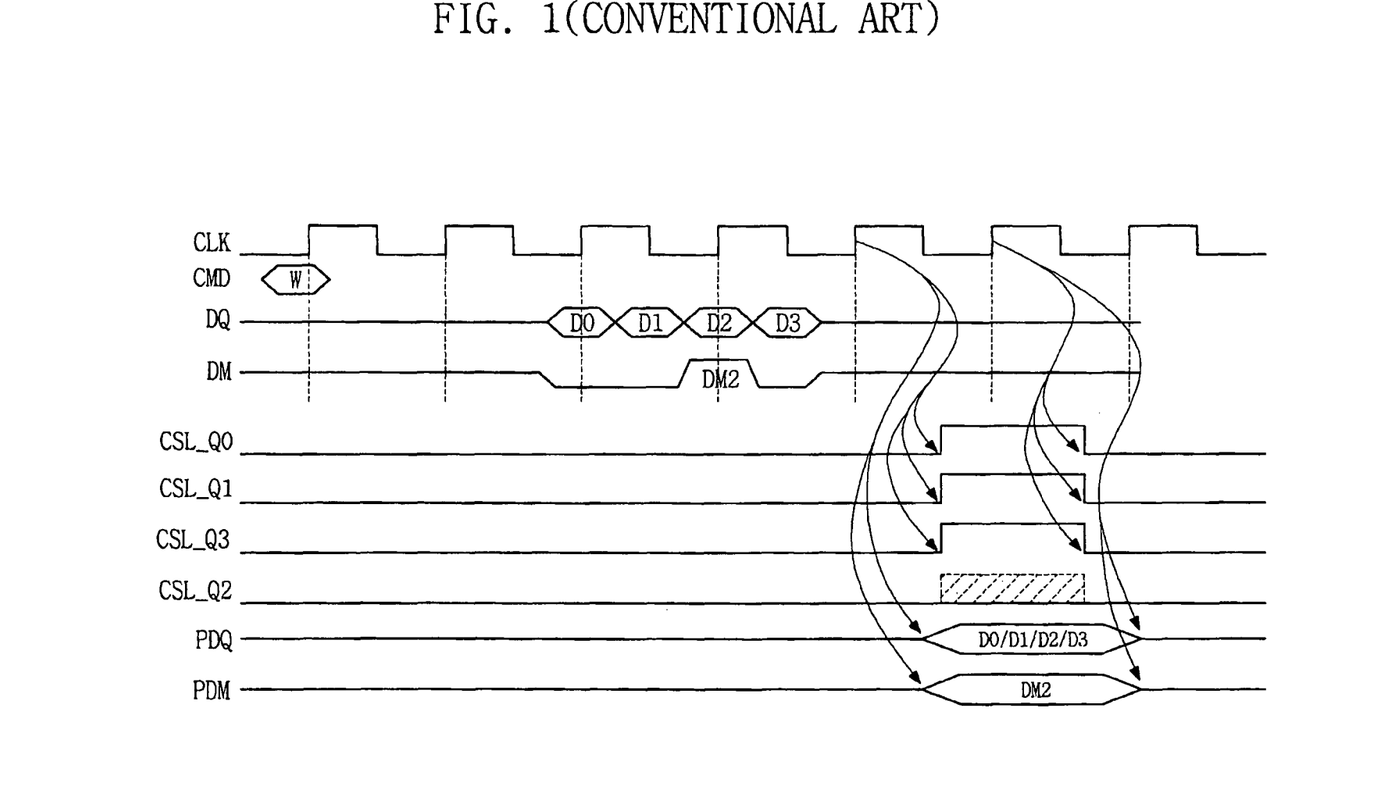
FIG. 1 illustrates timings for a data masking operation in a conventional semiconductor memory device.

FIG. 1 illustrates timings for a data masking operation in a conventional semiconductor memory device.

As shown in FIG. 1, if a write command signal W is applied, data D0,D1,D2,D3 and a data masking signal DM2 may be input after a given latency (e.g., 2 clock cycles). The data D0,D1,D2,D3 may be input sequentially, and if masking data in the data D0,D1,D2,D3 is a third data D2, data masking signal DM2 may be input concurrently with the third data D2. Likewise, if the second data D1 is to be masked, a second data masking signal DM1 may be input concurrently with the second data D1, and so on. That is, in the conventional semiconductor memory device, a write latency of the data D0,D1,D2,D3 and the data masking signal DM may be the same.

Referring to FIG. 1, the data D0,D1,D2,D3 may be processed in parallel by an internal write clock signal, and may be aligned as each internal data PDQ. While FIG. 1 illustrates data aligned by an external clock signal CLK instead of an internal clock signal, to the conventional semiconductor memory device may alternatively be configured to operate in response to an internal write clock signal which is synchronous to the external clock signal CLK. The internal write clock signal may be based on the external clock signal CLK, and in such situations the internal write clock signal may be alternatively represented by the external clock signal CLK. The data masking signal DM2 may also be aligned as an internal data masking signal PDM similar to that of the data D0,D1,D2,D3.

Referring to FIG. 1, the internal data D0,D1,D2,D3 may be aligned in parallel for a normal write operation if a column selection line corresponding to the data D0,D1,D2,D3 is enabled and the data D0,D1,D2,D3 may be transmitted to a memory cell through the column selection line CSL. However, if the internal data masking signal PDM to mask a write of third data D2 is provided, the column selection signal CSL_Q2 corresponding to the internal data masking signal PDM may not be enabled, even though the column selection lines CSL_Q0, CSL_Q1 and CSL_Q3 corresponding to the data D0, D1 and D3 may be normally enabled. In other words, a write operation may be designated only for the data D0, D1 and D3, while a write operation may also be performed for the third data D2 if the column selection line for the masking signal is not enabled.

Figure 2:
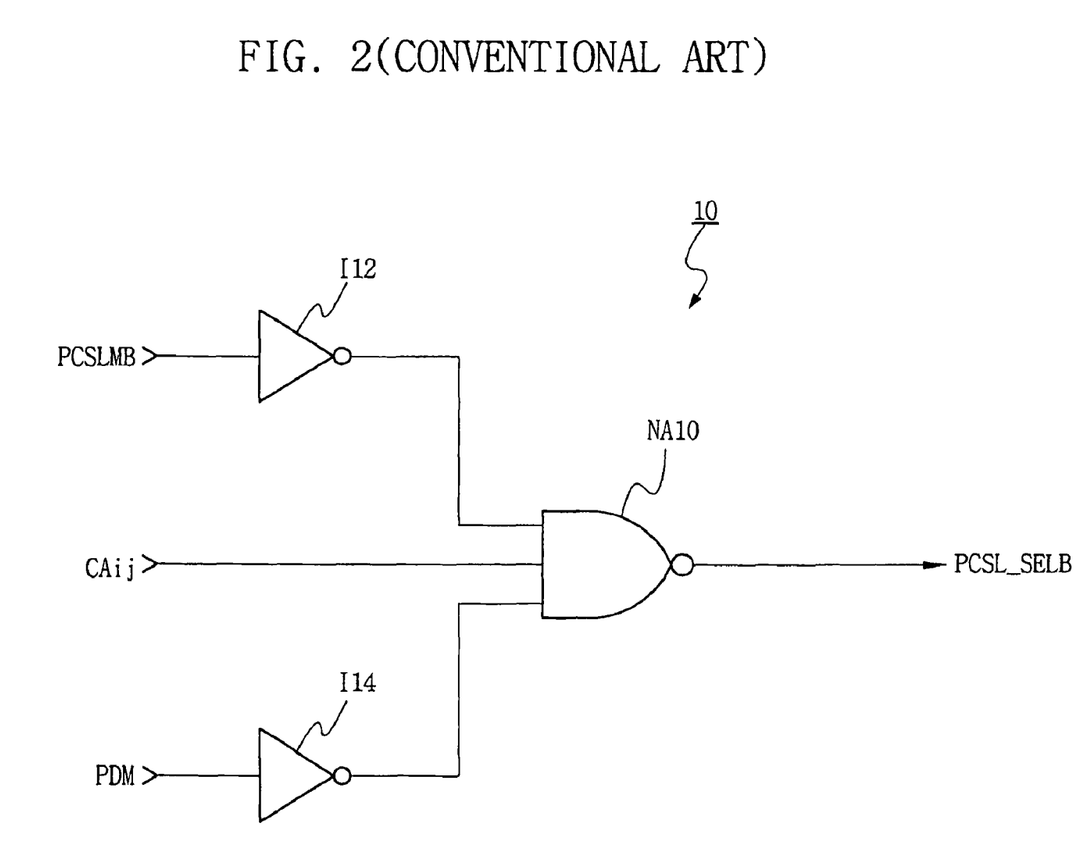
FIG. 2 illustrates a column selection line enable signal generator in a conventional semiconductor memory device.

Accordingly, a column selection line enable signal generator may be provided to enable or disable the column selection lines CSL in response to the data masking signal DM. An enable control of the column selection lines CSL_Q0, CSL_Q1, CSL_Q2 and CSL_Q3 may be performed by a column selection line enable signal generator 10 as shown in FIG. 2 (described below). The enable control of the column selection lines CSL_Q0, CSL_Q1, CSL_Q2 and CSL_Q3 may be performed in response to the clock signal CLK.

FIG. 2 illustrates a column selection line enable signal generator 10 in a conventional semiconductor memory device.

Referring to FIG. 2, the column selection line enable signal generator 10 may be provided at each column selection line within the conventional semiconductor memory device. The conventional column selection line enable signal generator 10 may include first and second inverters 112 and 114 and a NAND circuit NA10. The first inverter 112 may invert an inputted column selection line enable master signal PCSLMB. For example, if the first inverter 112 is enabled, the column selection line enable master signal PCSLMB may be output at a first logic level (e.g., a higher logic level or logic "1") if the column selection line enable master signal PCSLMB is received at a second logic level (e.g., a lower logic level or logic "0").

Referring to FIG. 2, the second inverter 114 may invert the internal data masking signal PDM. For example, if the second inverter 114 is enabled, the internal data masking signal PDM input at the second logic level (e.g., a lower logic level or logic "0") may be inverted to the first logic level (e.g., a higher logic level or logic "1").

Referring to FIG. 2, the NAND circuit NA10 may generate a column selection line enable signal PCSL_SELB as an output signal obtained by performing a logic operation (e.g., a Boolean logic operation such as a NAND operation) on an inverted signal of the column selection line enable master signal PCSLMB, an inverted signal of the internal data masking signal PDM and a column address signal CAij.

Referring to FIG. 2, the column selection line enable signal generator 10 may enable the column selection line enable signal PCSL_SELB if the column selection line enable master signal PCSLMB is set to the second logic level (e.g., before the inversion), the internal data masking signal PDM is set to the second logic level (e.g., before the inversion) and the column address signal CAij is set to the first logic level. If the column selection line enable signal PCSL_SELB is set to the second logic level (e.g., a lower logic level or logic "0"), the column selection line CSL may be enabled (e.g., set to the first logic level, such as a higher logic level or logic "1").

Referring to FIG. 2, if data DQ is input and data masking signal DM is not input (or disabled), each column selection line CSL corresponding to the data may be enabled, and a write operation for the data may be performed. However, if the data masking signal DM is input (or enabled), a column selection line corresponding to the data may not be enabled and the data write operation may not be performed.

Figure 3:
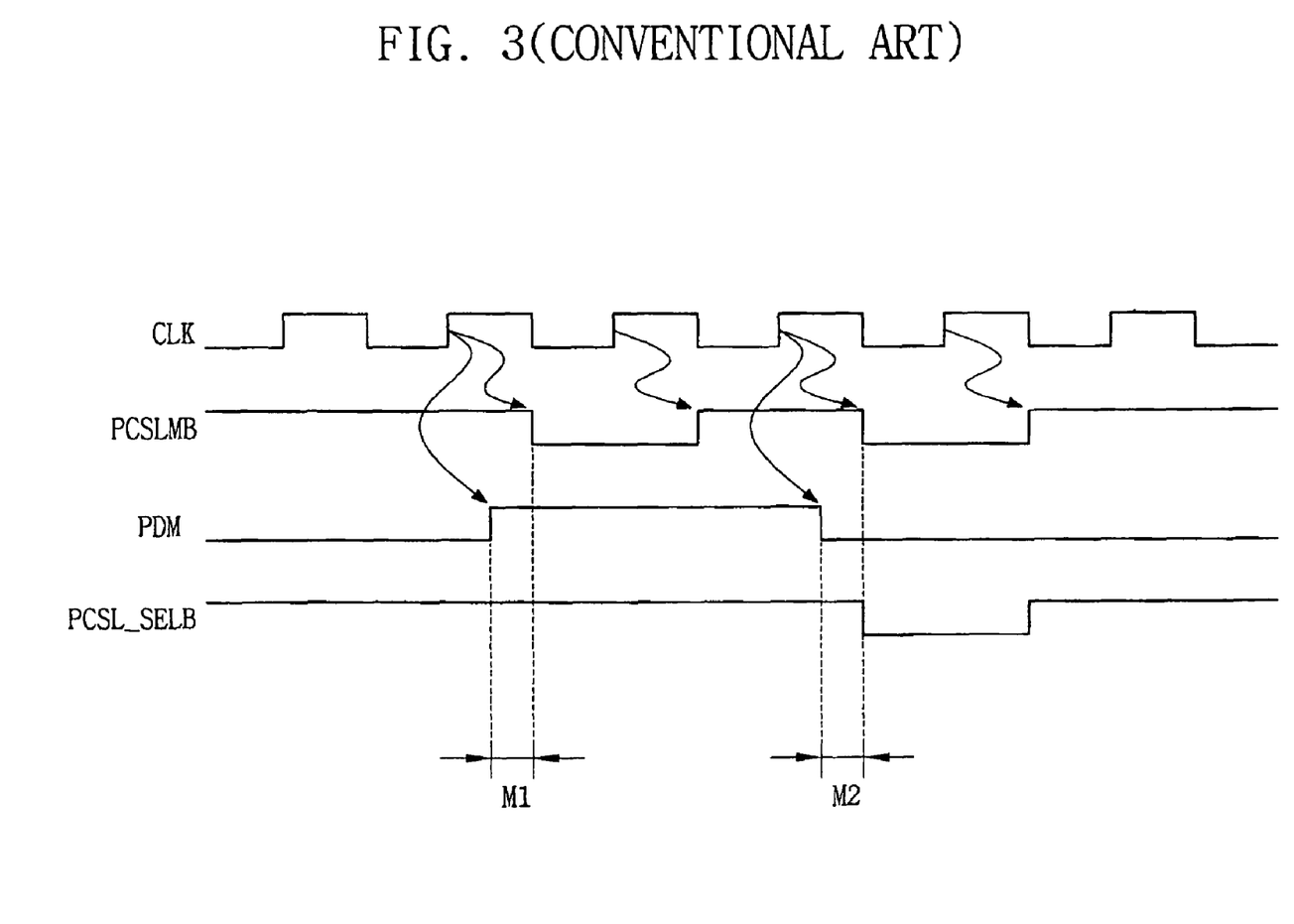
FIG. 3 illustrates timings for the data masking operation of FIG. 2.

FIG. 3 illustrates timings for the data masking operation of FIG. 2.

Referring to FIG. 3, the column selection line enable master signal PCSLMB and the data masking signal PDM may be enabled in response to a clock signal CLK. Thus, if data is input, the column selection line enable master signal PCSLMB may be input to the column selection line enable signal generator 10 at the second logic level (e.g., a lower logic level or logic "0"). Further, the internal data masking signal PDM corresponding to the data may be enabled and input at the first logic level (e.g., a higher logic level or logic "1"). Accordingly, the column selection line enable signal PCSL_SELB may not be enabled and a column selection line CSL may not be enabled. If the internal data masking signal PDM is not enabled (e.g., maintained at the second logic level), and if the column selection line enable master signal PCSLMB is input at the second logic level, the column selection line enable signal PCSL_SELB may be enabled (e.g., set to the first logic level).

Referring to FIG. 3, the internal data masking signal PDM may be enabled (e.g., set to the first logic level) in order to mask data. In an example, the internal data masking signal PDM may be enabled to the first logic level in advance, before the column selection line enable master signal PCSLMB is enabled, so as to prevent a masking column selection line from being enabled. If an enabling of the internal data masking signal PDM is slower or delayed more than that of the column selection line enable master signal PCSLMB, a column selection line may not be masked, which may cause a "glitch" for a given period of time wherein external data may be inadvertently written into a memory cell (e.g., instead of being masked or prevented from writing).

Furthermore, if the internal data masking signal PDM is enabled and then disabled, the internal data masking signal PDM may be disabled before the column selection line enable master signal PCSLMB is enabled. Thus, if the internal data masking signal PDM is disabled for too long of a time period, the mask operation may prevent the execution of a "normal" (e.g., non-masked) write operation.

As shown in FIG. 3, the above-described masking defects which may cause write operation errors (e.g., not writing data during an approved write operation, writing data during a masked operation, etc.) may be reduced if first and second masking margins M1 and M2 are maintained at sufficient levels. However, it may be difficult to maintain the first and second masking margins M1 and M2 at such idealized levels, for example, due to factors in a physical layout structure of chips, environmental factors, etc.

For example, in a semiconductor memory device having a physical wiring layout structure in which a transmission time of the column selection line enable master signal PCSLMB is shorter than that of the internal data masking signal PDM, it may be difficult to ensure the lengths of the first and second masking margins M1 and M2 precisely. Furthermore, the first and second masking margins M1 and M2 may become inverted (e.g., negative) if the data DQ and data masking signal DM are set up by a clock signal at the same time, and an inverse-margin may occur by a difference of transmission time reaching to the column selection line enable signal generator 10.

SUMMARY OF THE INVENTION

An example embodiment of the present invention is directed to a method of performing a memory operation in a semiconductor memory device; including receiving data and a data masking signal corresponding to at least a portion of the received data, the received data scheduled to be written into memory in response to a write command and the data masking signal configured to block the at least a portion of the received data from being written into the memory and configuring timing parameters differently for each of the received data and the data masking signal so as to execute the write command without writing the at least a portion of the received data into the memory.

Another example embodiment of the present invention is directed to a semiconductor memory device, including a flip flop circuit configuring timing parameters for each of received data and a data masking signal corresponding to at least a portion of the received data, the received data scheduled to be written into memory in response to a write command and the data masking signal configured to block at least a portion of the received data from being written into the memory, the flip flop circuit initially configuring the timing parameters to be different so as to execute the write command without writing the at least a portion of the received data into the memory.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
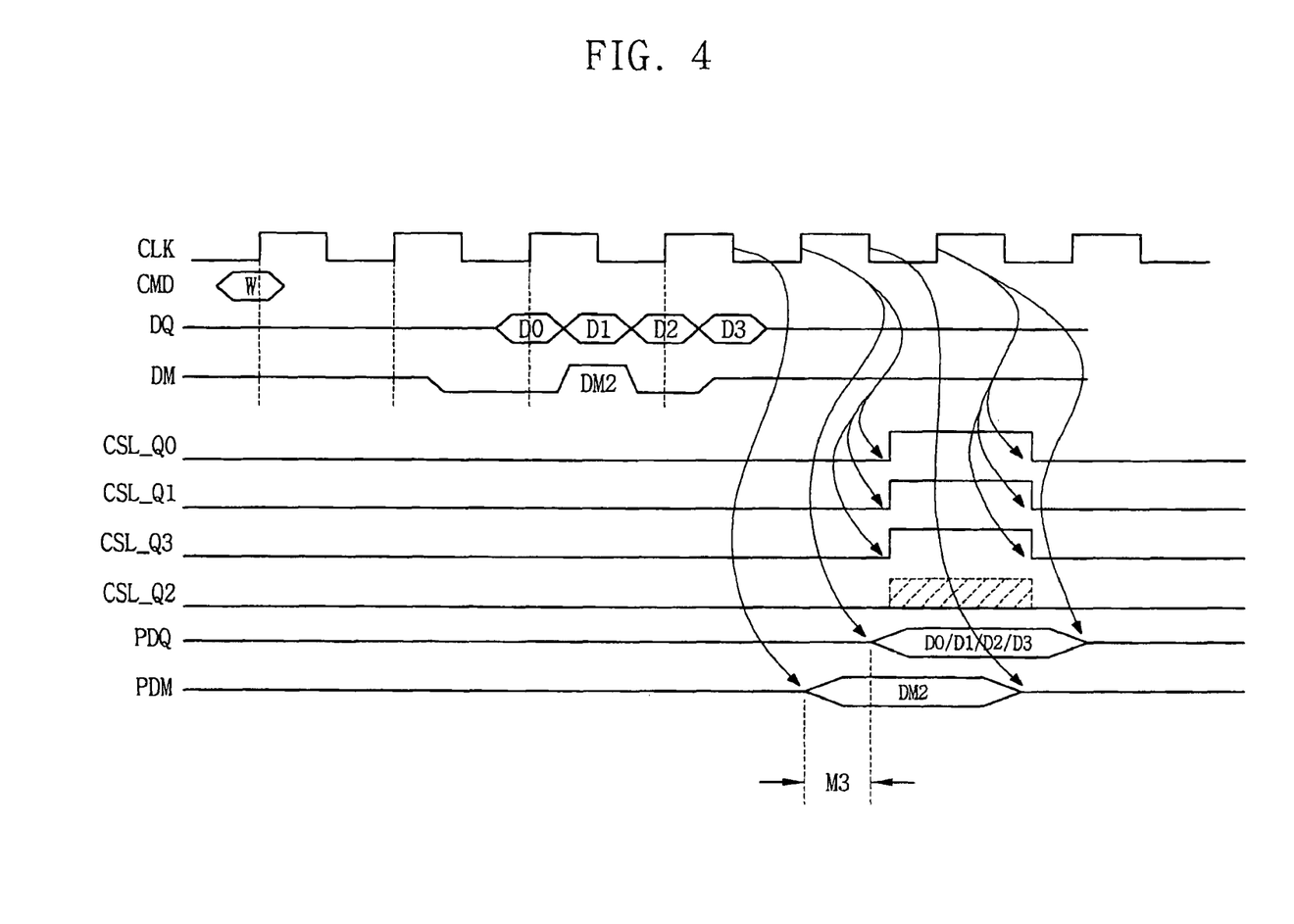
FIG. 4 illustrates timings for a data masking operation in a semiconductor memory device according to an example embodiment of the present invention.

FIG. 4 illustrates timings for a data masking operation in a semiconductor memory device according to an example embodiment of the present invention.

In the example embodiment of FIG. 4, a signal W of write command CMD may be applied to a given memory cell to perform a data write operation. If the signal W of write command CMD is applied, data DQ may be input after a given latency (e.g., 2 clock cycles) similar to the conventional art, while a data masking signal DM may have a latency different from the conventional art. Latency control may be achieved, for example, by inputting the data masking signal DM before the data DQ by a threshold time amount or alternatively by reducing a delay time of the data masking signal DM.

In the example embodiment of FIG. 4, in an example, a latency of the data masking signal DM may be configured to be shorter than the data DQ by a given time differential (e.g., 0.5 of a clock cycle, 1 clock cycle, etc.). Thus, in a specification for the semiconductor memory device, a write latency of the data masking signal DM may be defined or designed to be shorter than a write latency of the data DQ.

Hereinafter, with respect to the example embodiment of FIG. 4 and for purposes of example description only, it may be assumed that a write latency of the data DQ may be 2 clock cycles and a write latency of the data masking signal DM may be 1.5 clock cycles. It may further be assumed that a write of a third data D2 corresponds to masked data, such that the third data D2 is to be prevented from being written to the semiconductor memory device. Thus, in the example embodiment of FIG. 4, a write command signal W may be applied, and after 2 clock cycles (e.g., the write latency of data DQ), data D0, D1, D2 and D3 may be serially input. The data masking signal DM may be activated after the write command signal W is applied plus a lapse of 1.5 clock cycles (e.g., the write latency of the data masking signal DM). The data masking signal DM may be input in the same manner as that of the data DQ, such that the third data masking signal DM2 may be input concurrently with (e.g., in the same time period as) the second data D1.

In the example embodiment of FIG. 4, if a masking data is second data D1, a second data masking signal DM1 may be input concurrently (e.g., simultaneously) with an input of the first data D0. Likewise, if a latency of the data masking signal DM is 1 clock cycle, the third data masking signal DM2 may be input concurrently with (e.g., in the same time period as) the first data D0, and so on. Thus, in an example, the data masking signal may be aligned with or may coincide with data preceding that of the data to be masked.

In the example embodiment of FIG. 4, internal data PDQ and internal data masking signal PDM may be established at different time points. Related signals of the data DQ and related signals of the data masking signal DM may also be enabled or disabled at different time points.

In the example embodiment of FIG. 4, under the assumptions given above, the latency of the data masking signal DM may be 0.5 clock cycle shorter than that of the data DQ, thus the internal data masking signal PDM may be set up 0.5 clock cycles earlier than the internal data PDQ. Thus, the data D0, D1, D2 are D3 may be processed in parallel by an internal write clock signal, and each of the data D0, D1, D2 and D3 may be aligned as internal data PDQ. While FIG. 4 illustrates the data D0, D1, D2 and D3 aligned by an external clock signal CLK (e.g., and not an internal clock signal), it will be appreciated that the data D0, D1, D2 and D3 may alternatively be aligned with or synchronized to an internal clock signal. In an example, the internal clock signal may be based on the external clock signal CLK.

In the example embodiment of FIG. 4, the data masking signal DM2 may be aligned as internal data masking signal PDM, DM2, similar to that of the data D0,D1,D2,D3, but the data masking signal DM 2 may be set up earlier by 0.5 clock cycles as compared to the internal data PDQ. In an example, if a latency of the data masking signal DM is 1 clock cycle, a latency of the data DQ may be 2 clock cycles, and the internal data masking signal PDM may be set up earlier by 1 cycle as compared to the internal data PDQ.

In the example embodiment of FIG. 4, the internal data D0,D1,D2,D3 may be aligned in parallel for a normal write operation (e.g., a write operation with no masking) if a column selection line corresponding to the data D0,D1,D2,D3 is enabled and the data D0,D1,D2,D3 is transmitted to a memory cell through the column selection line CSL. However, if the internal data masking signal PDM, DM2 to mask a write of third data D2 is provided, a corresponding column selection line CSL_Q2 may not be enabled, but the column selection lines CSL_Q0, CSL_Q1 and CSL_Q3 corresponding to the data D0, D1 and D3 may be enabled (e.g., set to a first logic level, such as a higher logic level or logic "1"). Thus, the write operation may be performed for the data D0, D1 and D3 and not the third data D2 because the column selection line for the third data D2 may be disabled (e.g., set to a second logic level, such as a lower logic level or logic "0").

As shown in the example embodiment of FIG. 4, a masking margin M3 may be provided for the different latencies of data DQ and the data masking signal DM. Accordingly, an occurrence of a "glitch" caused by an enabling of a column selection line which is not scheduled to be masked may be prevented or at least reduced during a write operation.

In the example embodiment of FIG. 4, while the masking margin M3 may be established given the different latencies of the data DQ and the data masking signal DM, the masking margin M3 may control an enabling of the column selection line. After this time point, however, the latency of the data masking signal PDM may be required to be the same as that of the data PDQ (e.g., such that maintaining the data DQ and the data masking signal DM at different latencies is only a temporary condition), which will be below described with reference to the example embodiment of FIG. 6.

Figure 5:
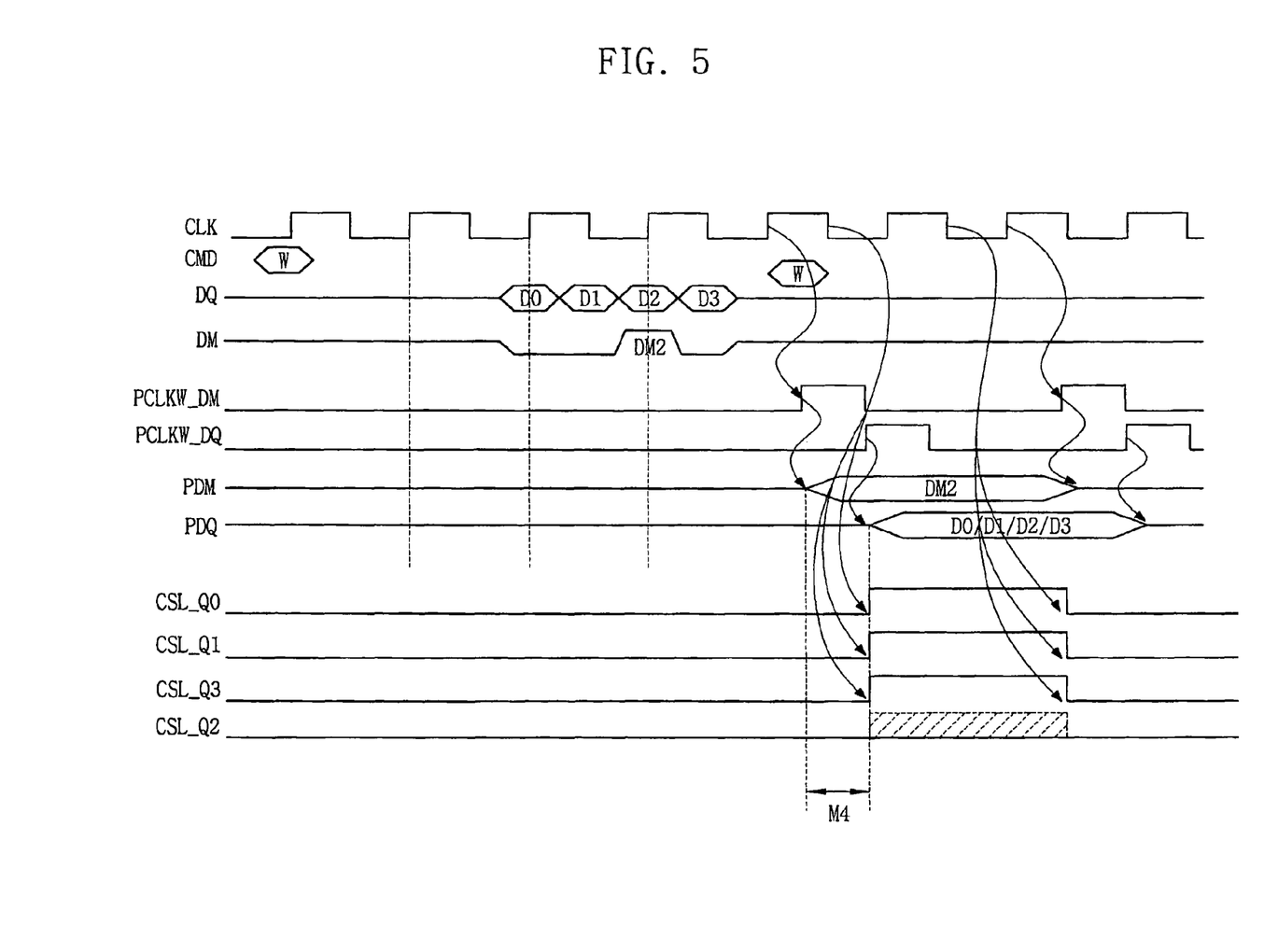
FIG. 5 illustrates timings for a data masking operation in a semiconductor memory device according to another example embodiment of the present invention.

FIG. 5 illustrates timings for a data masking operation in a semiconductor memory device according to another example embodiment of the present invention.

In the example embodiment of FIG. 5, a signal W of write command CMD may be applied to a given memory cell to perform a data write operation. If the signal W of write command CMD is applied, data DQ may be input after a given latency (e.g., 2 clock cycles) similar to the conventional art. The data masking signal DM may also be input after the same latency (e.g., 2 clock cycles) as the data DQ.

In the example embodiment of FIG. 5, the data D0, D1, D2 and D3 may be serially input. If a masking data corresponds to the third data D2, data masking signal DM2 may be input at an input time point corresponding to or aligned with that of the third data. Alternatively, if a masking data is a second data D1 (not shown), the second data masking signal DM1 may be input concurrently with (e.g., simultaneously) an input of the second data D1, and so on. Write latencies of the data DQ and the data masking signal DM may be the same in the example embodiment of FIG. 5, similar to the conventional art.

In the example embodiment of FIG. 5, the data DQ and the data masking signal DM may be processed in parallel by an internal write clock signal PCLKW, and each of the data DQ and the data masking signal DM may be aligned as internal data PDQ and internal data masking signal PDM. In an example, the data DQ and the data masking signal DM may be controlled by separate independent internal write clock signals.

In the example embodiment of FIG. 5, the data DQ may be aligned with and controlled by a first internal clock signal PCLKW_DQ, and the data masking signal DM may be aligned with and controlled by a second internal clock signal PCLKW_DM. The first internal clock signal PCLKW_DQ and the second internal clock signal PCLKW_DM may be synchronized with the external clock signal CLK (e.g., or alternatively an internal clock signal based on the external clock signal CLK). A phase of the second internal clock signal PCLKW_DM may precede a phase of the first internal clock signal PCLKW_DQ by a given time period (e.g., 0.5 clock cycles). The phase differential between the first and second internal clock signals PCLKW_DQ and PCLKW_DM ("internal clock phase differential") may be equal to, for example, 1 clock cycle.

In the example embodiment of FIG. 5, the internal data masking signal PDM may be set up earlier by 0.5 clock cycle than the data PDQ. If the internal clock phase differential is 1 clock cycle, the internal data masking signal PDM may be set up 1 clock cycle earlier than the internal data PDQ.

In the example embodiment of FIG. 5, the internal data D0,D1,D2,D3 may be aligned in parallel for a normal write operation where a column selection line corresponding to the data D0,D1,D2,D3 is enabled and the data D0,D1,D2,D3 may be transmitted to a memory cell through their respective column selection line CSL. However, if the internal data masking signal PDM, DM2 is configured to mask a write of the third data D2, a column selection line CSL_Q2 corresponding to the third data D2 may not be enabled, and column selection lines CSL_Q0, CSL_Q1 and CSL_Q3 corresponding to the data D0, D1 and D3, respectively, may be enabled. Thus, the write operation may be performed for the data D0, D1 and D3 and not the third data D2 because the column selection line CSL_Q2 for the third data D2 may be disabled (e.g., set to a second logic level, such as a lower logic level or logic "0").

In the example embodiment of FIG. 5, a masking margin M4 may be provided by controlling an alignment of the data DQ and the data masking signal DM with the first and second internal clock signals PCLKW_DQ and PCLKW_DM, which may be configured to have different relative phases. Accordingly, the masking margin M4 may allow the semiconductor memory device according to an example embodiment of the present invention to reduce an occurrence of glitches or memory defects.

In the example embodiment of FIG. 5, the masking margin M4 may be established based on the internal clock phase differential, and the masking margin M4 may control an enabling of the column selection line. After this time point (e.g., after the masking margin M4), however, the internal clock phase differential may be "reset" to zero (e.g., the internal clock signals are "in phase" such that the internal clock phase differential is only a temporary condition).

Figure 6:
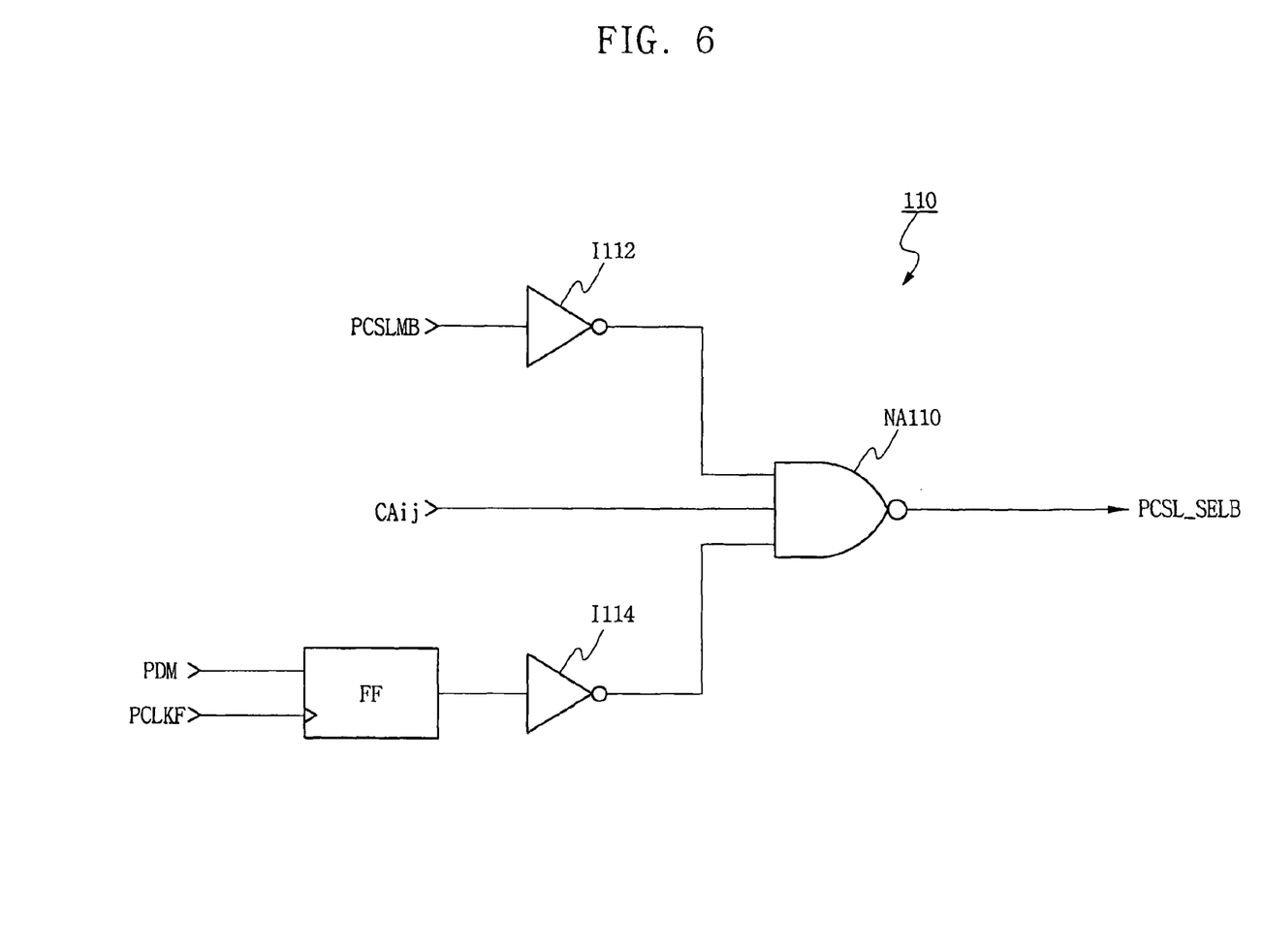
FIG. 6 illustrates a column selection line enable signal generator according to another example embodiment of the present invention.

FIG. 6 illustrates a column selection line enable signal generator 110 according to another example embodiment of the present invention. In an example, the column selection line enable signal generator 110 may be configured to generate the masking margin M3 in accordance with the example embodiment of FIG. 4 (e.g., based on different latency settings for the data and the masking signal) and/or the masking margin M4 in accordance with the example embodiment of FIG. 5 (e.g., based on an internal clock phase differential). Further, in the example embodiment of FIG. 6, after a generation of the column selection line enable signal, the different latencies or internal clock phases allocated to the internal data PDQ and its related signals, and the internal data masking signal PDM and its related signals, may become equal, such that the phase or latency differential may be a temporary condition sufficient to establish the masking margin M3 and/or M4.

In the example embodiment of FIG. 6, the column selection line enable signal generator 110 may be representative of one of a plurality of column selection line enable signal generators 110, wherein one column selection line enable signal generator 110 is positioned at each column selection line of the semiconductor memory device.

In the example embodiment of FIG. 6, the column selection line enable signal generator 110 may include first and second inverters 1112 and 1114, a flip-flop circuit FF and a NAND circuit NA110. The flip-flop circuit FF may be configured to control either phase differences (e.g., of respective internal clock signals, such as in FIG. 5) or latencies of the internal data masking signal PDM and the internal data PDQ (e.g., see FIG. 4).

In the example embodiment of FIG. 6, in an example, the flip-flop circuit FF may be a D flip-flop. A clock signal PCLK input to the flip-flop circuit FF may control adjust the internal data PDQ and the internal data masking signal PDM so as to have either the same phase and/or latency. In an example, the clock signal PCLK may be generated using a conventional clock generator, or may alternatively be received from an external source.

In the example embodiment of FIG. 6, the first inverter 1112 may invert an inputted column selection line enable master signal PCSSMP. For example, if the first inverter 1112 is enabled, a column selection line enable master signal PCSLMB input at the second logic level (e.g., a lower logic level or logic "0") may be inverted to the first logic level (e.g., a higher logic level or logic "1").

In the example embodiment of FIG. 6, the second inverter 1114 may invert an output signal of the flip-flop circuit FF (e.g., internal data mask signal PDM). If the second inverter 1114 is enabled, the internal data mask signal PDM input at the second logic level (e.g., a lower logic level or logic "0") may transition to the first logic level (e.g., a higher logic level or logic "1").

In the example embodiment of FIG. 6, the NAND circuit NA10 may generate a column selection line enable signal PCSL_SELB as an output signal. The column selection line enable signal PCSL_SELB may be generated by performing a logic operation (e.g., a NAND operation) on the inverted version of the column selection line enable master signal PCSLMB (e.g., output from inverter 1112), an output signal of the second inverter 1114 and a column address signal CAij.

In the example embodiment of FIG. 6, the column selection line enable signal generator 10 may enable the column selection line enable signal PCSL_SELB at the second logic level (e.g., a lower logic level or logic "0") if the column selection line enable master signal PCSLMB is set to the second logic level, the internal data mask signal PDM is set to the second logic level and the column address signal CAij is set to the first logic level (e.g., a higher logic level or logic "1"). If the column selection line enable signal PCSL_SELB is set to the second logic level (e.g., for the purposes of the NAND gate, this is an "enabled" state), column selection line CSL may be enabled at the first logic level (e.g., a higher logic level or logic "1").

In the example embodiment of FIG. 6, if data DQ is input and data masking signal DM is not enabled, each column selection lines CSL corresponding to the data may enabled and a write operation for the input data may be executed (e.g., without masking). In an alternative example, if the data masking signal DM is enabled and data corresponding to the data masking signal DM is input, a column selection line corresponding to the data to be masked may not be enabled so as to prevent a write operation of the masked data.

In another example embodiment of the present invention, internal data DQ and internal data masking signal PDM may be associated with internal clock signals at different phases so as to obtain a given masking margin. In an example, the particular "target" masking margin to be achieved may be set by a design engineer based on empirical study. After the masking margin has been obtained, the different phases or internal clock phase differential may be reduced (e.g., to zero) such that the internal data DQ and internal data masking signal PDM may be thereafter be associated with clock signals having the same phase.

In another example embodiment of the present invention, latencies of data and a data masking signal may be different, or alternatively the data and data masking signal may be controlled by clock signals having different phases, in order to provide a masking margin sufficient to avoid a memory glitch. Accordingly, glitches caused by an enabling of a column selection line which is intended to be disabled in order to facilitate a masking operation may be reduced.

Example embodiments of the present invention being thus described, it will be obvious that the same may be varied in many ways. For example, while the example embodiments described above use specific numerical examples of phase differentials (e.g., 1 clock cycle) and write latencies (e.g., 1.5 clock cycles, 2 clock cycles, etc.), it is understood that such numerical examples are given for example purposes only, and other example embodiments of the present invention may be directed to semiconductor memory devices having any phase differential and/or write latency. Further, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A method of performing a memory operation in a semiconductor memory device, comprising:
receiving a write command signal from a memory controller;

receiving data from the memory controller, the data including n pieces of data, wherein a k-th piece of the pieces of data comprises masking data to be masked; and receiving a data masking signal from the memory controller, the data masking signal enabling data masking, wherein the data masking signal is used to mask the k-th piece of data, wherein a latency between receiving the write command signal and receiving the data masking signal is less than a latency between receiving the write command signal and receiving the k-th piece of data.

2. The method of claim 1, further comprising:
receiving a clock signal, wherein the latency between receiving the write command signal and receiving the data masking signal is at least 0.5 clock cycles less than the latency between receiving the write command signal and receiving the k-th piece of data.

3. The method of claim 1, further comprising:
in response to the write command signal and the data masking signal, blocking the k-th piece of data so it is not written into a memory cell array, and writing only remaining data of the received data into the memory cell array.

4. The method of claim 1, wherein the write command signal, the data masking signal, and the k-th piece of data are input to the memory device in the following sequential order: (1) write command signal; (2) data masking signal; (3) k-th piece of data.

5. A method of controlling a semiconductor memory device, comprising:
transmitting a write command signal to the semiconductor memory device;
transmitting data to the semiconductor memory device, the data including n pieces of data, wherein a k-th piece of the n pieces of data comprises masking data to be masked; and
transmitting a data masking signal to the semiconductor memory device, the data masking signal enabling data masking, wherein the data masking signal is used to mask the k-th piece of data,
wherein transmission of the data masking signal begins prior to transmission of the k-th piece of data.

6. The method of claim 5, further comprising:
transmitting a clock signal, wherein the transmission of the data masking signal begins at least 0.5 clock cycles prior to the transmission of the k-th piece of data.

7. The method of claim 5, further comprising:
in response to the write command signal and the data masking signal, blocking the k-th piece of data so it is not written into a memory cell array, and writing only remaining data of the transmitted data into the memory cell array.

8. The method of claim 5, wherein the write command signal, the data masking signal, and the k-th piece of data are transmitted to the semiconductor memory device in the following sequential order: (1) write command signal; (2) data masking signal; (3) k-th piece of data.

9. A semiconductor memory device, comprising:
a memory cell array;
a command receiving circuit configured to receive a write command signal from a memory controller;
a data receiving circuit configured to receive data from the memory controller, the data including n pieces of data, wherein a k-th piece of the n pieces of data comprises masking data to be masked;

a data masking signal receiving circuit configured to receive a data masking signal from the memory controller, the data masking signal enabling data masking, wherein the data masking signal is used to mask the k-th piece of data; and wherein a latency between receiving the write command signal and receiving the data masking signal is less than a latency between receiving the write command signal and receiving the k-th piece of data, and wherein the data masking information receiving circuit comprises a flip-flop circuit configured to adjust the latency for the data masking signal.

10. The semiconductor memory device of claim 9, wherein:
the flip-flop circuit is configured to adjust the latency for the data masking signal after the data receiving circuit begins to receive the data.

11. The semiconductor memory device of claim 10, wherein the flip-flop circuit is configured to adjust the latency between receiving the write command and receiving the data masking signal, so that it equals the latency between receiving the write command and receiving the k-th piece of data.

12. The semiconductor memory device of claim 9, further comprising:
a column selection line enable signal generation circuit configured to perform a logical operation on a column selection line enable master signal, an output signal of the flip flop and a column address signal and generate a column selection line enable signal.

13. The semiconductor memory device of claim 9, further comprising:
a data write circuit configured to block the k-th piece of data so it is not written into a memory cell array, and to write only remaining data of the received data into the memory cell array, in response to the write command signal and the data masking signal.

14. A memory controller, comprising:
a command transmitting circuit configured to transmit a write command signal to a memory device;
a data transmitting circuit configured to transmit data to the memory device, the data including n pieces of data, wherein a k-th piece of the n pieces of data is masking data to be masked; and
a data masking signal transmitting circuit configured to transmit a data masking signal to the memory device, the data masking signal enabling data masking, wherein the data masking information is used to mask the k-th piece of data; and
wherein the memory controller is configured to begin transmitting the data masking signal prior to beginning transmission of the k-th piece of data.

15. The memory controller of claim 14, wherein the memory controller is configured to transmit the write command signal, the data masking signal, and the k-th piece of data to the semiconductor memory device in the following sequential order: (1) write command signal; (2) data masking signal; (3) k-th piece of data.

16. The memory controller of claim 15, further comprising:
a latency controller configured to control a latency of the data masking signal and a latency of the k-th piece data to have different latencies.

* * * * *